United States Patent [19]

Mira et al.

[11] Patent Number: 5,735,340
[45] Date of Patent: Apr. 7, 1998

[54] HEAT SINK WITH INTEGRAL ATTACHMENT MECHANISM

[75] Inventors: Ali Mira, San Jose, Calif.; Mark August, deceased, late of Los Gatos, Calif., by Tamara August, legal representative

[73] Assignee: Silicon Graphics, Inc., Mountain View, Calif.

[21] Appl. No.: 649,769

[22] Filed: May 15, 1996

[51] Int. Cl.⁶ ............................... H05K 7/20; H01L 23/40
[52] U.S. Cl. .................. 165/80.3; 165/185; 174/16.3; 361/697; 361/704; 257/722
[58] Field of Search ......................... 165/80.3, 185; 174/16.3; 257/722; 361/697, 704, 710, 719, 720

[56] References Cited

U.S. PATENT DOCUMENTS

| | | | |
|---|---|---|---|
| 4,849,456 | 7/1989 | Funari et al. | 165/185 X |
| 5,262,922 | 11/1993 | Yamaji et al. | 361/720 |

FOREIGN PATENT DOCUMENTS 5-29778  2/1993  Japan ........................ 361/704

OTHER PUBLICATIONS

IBM Tech. Disclosure Bulletin vol. 33 No. 3B "Surface Mounted Heat Sink Attach for Tab", pp. 101, 102 Aug. 1990.

*Primary Examiner*—Allen J. Flanigan
*Attorney, Agent, or Firm*—Wagner, Murabito & Hao

[57] ABSTRACT

A thermally conductive heat sink unit having an integral attachment mechanism. In the present invention, a thermally conductive unit is adapted to thermally contact a heat generating device mounted on a substrate. A flexible connector is integral with the thermally conductive unit. The flexible connector is adapted to couple the thermally conductive unit to the substrate such that the thermally conductive unit thermally contacts the heat generating device.

4 Claims, 6 Drawing Sheets

HEAT SINK WITH INTEGRAL ATTACHMENT MECHANISM

TECHNICAL FIELD

This invention relates to heat removal devices. Specifically, the present invention relates to a heat sink having an integral attachment mechanism for connecting the heat sink to an underlying substrate.

BACKGROUND ART

As integrated circuit (IC) chip densities increase, the mount of heat generated by the IC chip also increases. Removing the excess heat generated by the IC chip is necessary to insure proper operation. More specifically, if the excess heat is not removed, the excess heat can literally burn-up and destroy the IC chip. Numerous heat sink devices have been proposed to remove heat from the IC chip.

Typically, prior art heat sink devices are comprised of multiple components, i.e. combinational heat sink units. The multiple components commonly include a heat radiating portion and a connector portion. The connector portion is snap fit or screwed to the heat radiating portion of the heat sink. Often, a part of the heat radiating portion, such as a few cooling fins, must be removed to accommodate attaching the connector portion to the heat radiating portion. As a result, the effectiveness of the heat radiating portion is reduced. The connector portion is then used to hold the heat radiating portion against the heat generating device and to connect the heat radiating portion to an underlying substrate on which the heat generating device is mounted.

As yet another drawback, prior art connector portions often loosen or detach from the heat radiating portion. The loosening and or detachment is caused by handling, thermal cycling, and the like. For example, as the heat radiating portion heats and cools, the heat radiating portion expands and contracts accordingly. Hence, a connector portion which is snap fit to the heat radiating portion is subjected to stresses and strains. The stresses and strains can cause the connector portion to loosen or detach completely from the heat radiating portion. If the connector portion is no longer firmly coupled to the heat radiating portion, contact between the heat radiating portion and the heat generating device is compromised. Thus, the heat radiating device will not effectively cool the heat generating device. Therefore, excess heat can build up and destroy or adversely affect operation of the IC chip to which the heat radiating device was supposed to be attached.

Another drawback associated with prior art heat radiating and connector portion combinations is that such devices are extremely difficult to manufacture. Each of the multiple components associated with prior art combinational heat sink units requires tight tolerancing to insure that the components can be attached or snap fit together. The manufacturing of multiple components also has substantial cost associated therewith. As a result, prior art combinational heat sink devices have significant manufacturing costs associated therewith. The high manufacturing costs, in turn, cause the prior art combinational heat sinks to be extremely expensive.

Thus, a need exists for a heat sink unit which can be efficiently and reliably coupled to a heat generating device and an underlying substrate. A further need exists for a heat sink which can be efficiently and reliably coupled to a heat generating device and an underlying substrate without requiring complicated and difficult to manufacture connecting components. Yet another need exists for a heat sink meeting the above listed needs and which does not have the substantial manufacturing costs associated with conventional heat sinks.

DISCLOSURE OF THE INVENTION

The present invention provides a heat sink unit which can be efficiently and reliably coupled to a heat generating device and an underlying substrate, a heat sink unit which can be efficiently and reliably coupled to a heat generating device and an underlying substrate without requiring complicated and difficult to manufacture connecting components, and the present invention provides such advantages in a heat sink unit which does not have the substantial manufacturing costs associated with conventional heat sinks.

A thermally conductive heat sink unit having an integral attachment mechanism is disclosed. In the present invention, a thermally conductive unit is adapted to thermally contact a heat generating device mounted on a substrate. A flexible connector is integral with the thermally conductive unit. Thus, the present invention has both a thermally conductive unit and a flexible connector formed of a single piece of material. The flexible connector is adapted to couple the thermally conductive unit to the substrate such that the thermally conductive unit thermally contacts the heat generating device.

Specifically, in one embodiment of the present invention, a thermally conductive unit is adapted to thermally contact a heat generating device mounted on a substrate. In the present embodiment, the heat generating device is an integrated circuit, such as an application specific integrated circuit (ASIC). A flexible connector is integral with the thermally conductive unit. That is, the flexible connector and the thermally conductive unit are formed from the same piece of material. The flexible connector is further comprised of a plurality of posts extending outwardly from the thermally conductive unit. Each of the plurality of posts has a side surface and a bottom surface. The bottom surface is adapted to be disposed adjacent to the surface of the substrate on which the heat generating device is mounted. The bottom surface of each of the plurality of posts has a threaded opening formed therein for receiving a respective screw extending from the substrate. In so doing, the thermally conductive unit can be screwed to the substrate.

In yet another embodiment, the present invention includes the features of the previous embodiments and further bevels the bottom surface of each of the plurality of posts such that the bottom surface of each of the plurality of posts is disposed substantially parallel to the substrate when the plurality of posts are bent.

Other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
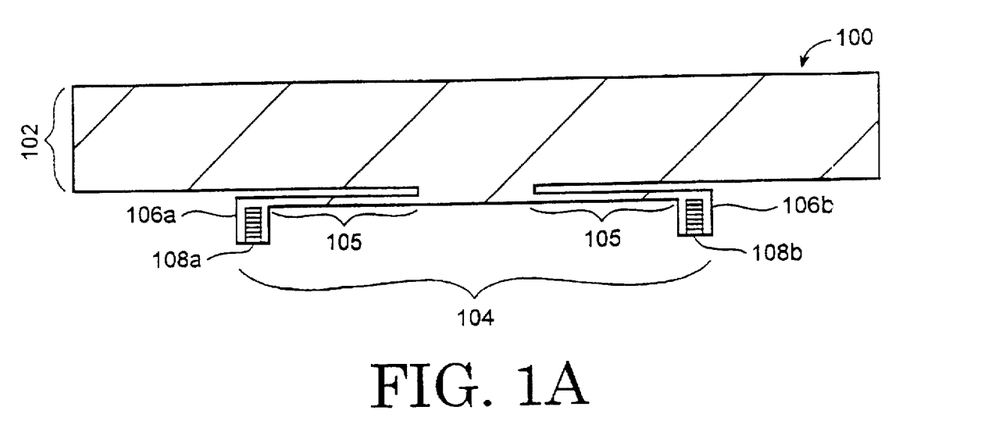
FIG. 1A is a side cut-away view of a heat sink unit in accordance with the present claimed invention.

With reference now to FIG. 1A, a side cut-away view of a heat sink unit 100 in accordance with the present invention is shown. In the present invention, heat sink unit 100 is comprised of a thermally conductive unit 102 and a flexible connector portion 104. In the present invention, flexible connector 104 is integral with thermally conductive unit 102. That is, flexible connector 104 and thermally conductive unit 102 are formed of the same piece of material. Thus, the present invention is a single heat sink unit in which flexible connector 104 is an extension of thermally conductive unit 102 or vice versa. Hence, the present invention eliminates the need to snap fit or otherwise attach any connecting portion to a heat radiating portion as found in prior art combinational heat sink units. Thus, in the present invention thermally flexible connector portion 104 does not loosen or detach from conductive portion 102.

With reference still to FIG. 1A, the present embodiment flexible connector 104 includes a horizontal portion 105 and a plurality of vertically oriented posts 106a and 106b which extend from horizontal portion 105. The present embodiment further includes posts 106c and 106d which are hidden behind posts 106a and 106b, respectively. The present embodiment also includes a hidden horizontal portion 107 to which hidden posts 106c and 106d are attached. As shown in FIG. 1A, posts 106a and 106b extend outwardly from thermally conductive unit 102. In the present invention, flexible connector 104 is pliable. That is, flexible connector 104 can be bent or moved with respect to thermally conductive unit 102. Thus, in the present invention, horizontal portion 105 and attached posts 106a and 106b can be bent, for example, away from thermally conductive unit 102. Additionally, in one embodiment, posts 106a and 106b have threaded openings 108a and 108b, respectively, formed into the bottom surface thereof. Likewise, in the present embodiment, hidden posts 106c and 106d have threaded openings 108c and 108d, respectively, formed into the bottom surface thereof. Although four posts are recited in the present embodiment, the present invention is also well suited to having a fewer or greater number of posts. For example, the present invention is well suited to having a single post extend outwardly from thermally conductive unit 102. Furthermore, although threaded openings are recited in the present embodiment, the present invention is also well suited to having non-threaded openings formed into the bottom of the posts, or to not having any openings formed into the bottom of the posts.

Figure 2:
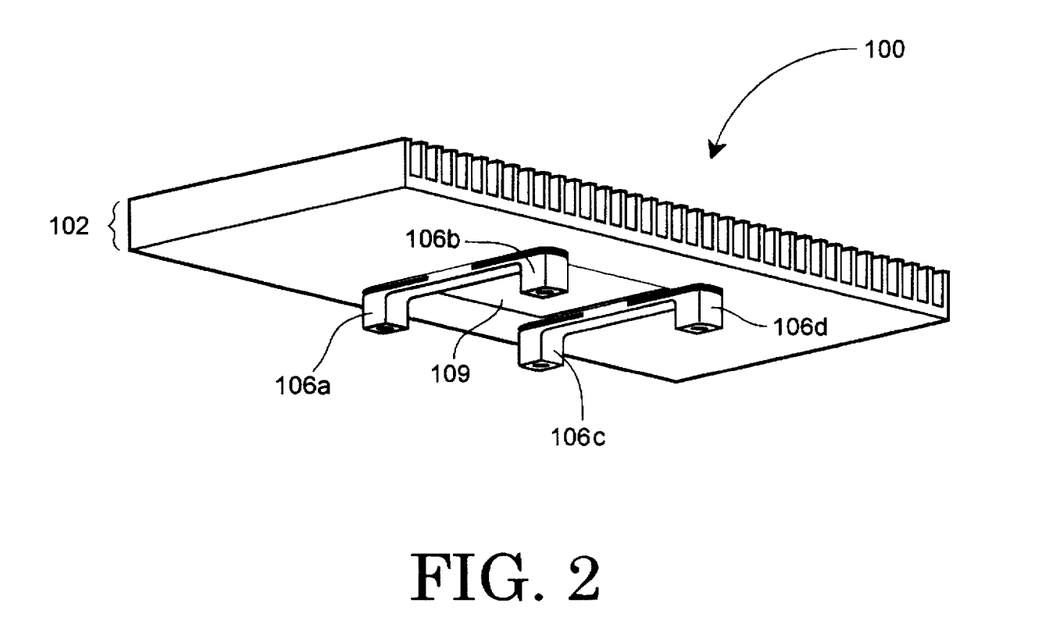
FIG. 2 is a perspective view of a heat sink unit in accordance with the present claimed invention.

With reference next to FIG. 2, a perspective view of heat sink unit 100 is shown. In FIG. 2, each of posts 106a–106d and threaded openings 108a–108d are shown. In the present embodiment, a recessed area 109 is formed into the bottom surface of thermally conductive unit 102. Recessed area is sized such that the top surface of a heat generating device will fit therein. The present invention is also well suited to having a recessed area with different depth and/or size formed therein. Additionally, the present invention is also well suited to not having a recessed area formed into the bottom surface of thermally conductive unit 102.

Figure 3:
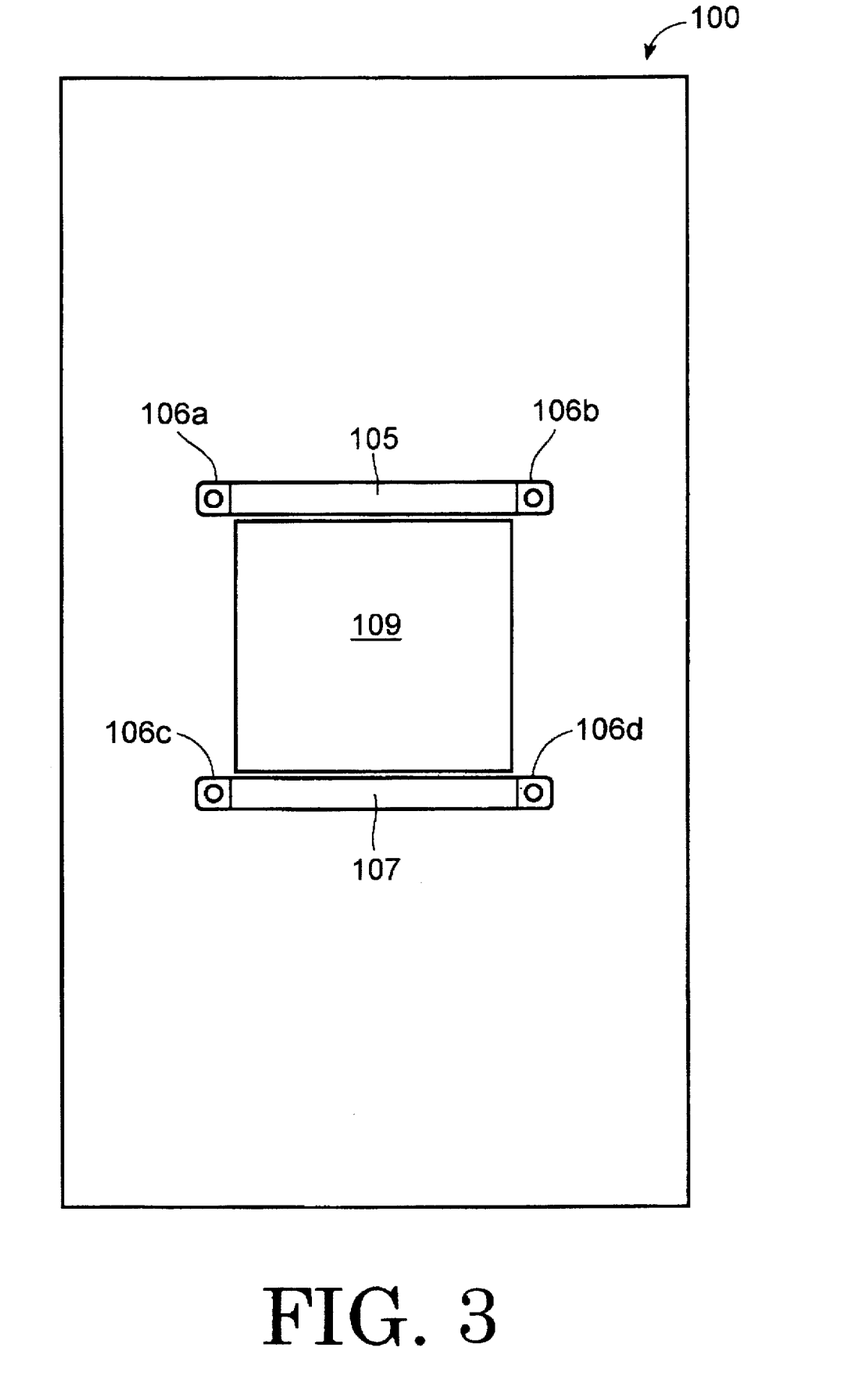
FIG. 3 is a bottom plan view of a heat sink unit in accordance with the present claimed invention.

Referring now to FIG. 3, a bottom view of heat sink unit 100 is shown. The bottom view of FIG. 3 clearly shows the position of posts 106a–106d and horizontal portions 105 and 107 with respect to thermally conductive unit 102 and recessed area 109. Although such positioning of posts 106a–106d and horizontal portions 105 and 107 is shown in the present embodiment, the present invention is also well suited to not having posts 106a–106d, horizontal portions 105 and 107, and recessed area 109 located elsewhere on the bottom surface of thermally conductive unit 102.

Figure 1B:
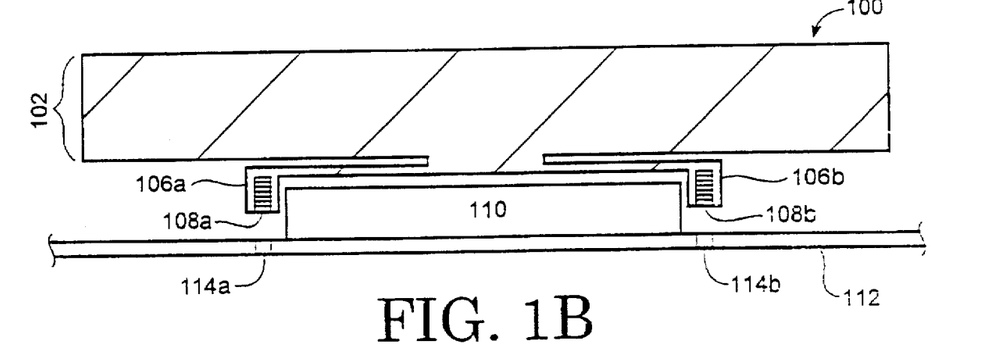
FIG. 1B is a side cut-away view of a heat sink unit disposed above a heat generating device mounted to a substrate in accordance with the present claimed invention.

With reference next to FIG. 1B, a side cut-away view of heat sink unit 100 disposed above a heat generating device 110 mounted on a substrate 112 is shown. In the present embodiment, heat generating device 110 is an integrated circuit such as, for example, an application specific integrated circuit (ASIC), and substrate 112 is a printed circuit board. Holes 114a and 114b are formed into substrate 112 in the present embodiment. Holes 114a and 114b are disposed such that they reside beneath threaded openings 108a and 108b of posts 106a and 106b. Likewise, in the present embodiment, hidden holes 114c and 114d are formed into substrate 112 such that they are disposed beneath hidden holes 108c and 108d, respectively. Although such a heat generating device is specified in the present embodiment, the present invention is also well suited to the use of other types of heat generating devices such as, for example, various packaged and unpackaged integrated circuits, other heat generating electrical components, and the like.

Similarly, although a printed circuit board substrate is specified in the present embodiment, the present invention is also well suited to the use of various other types of substrates to which a heat generating device can be attached. As shown in FIG. 1B, the present invention is adapted to be disposed over a heat generating device such that the bottom surface of thermally conductive unit 102 is in thermal contact with a surface of the heat generating device.

Figure 1C:
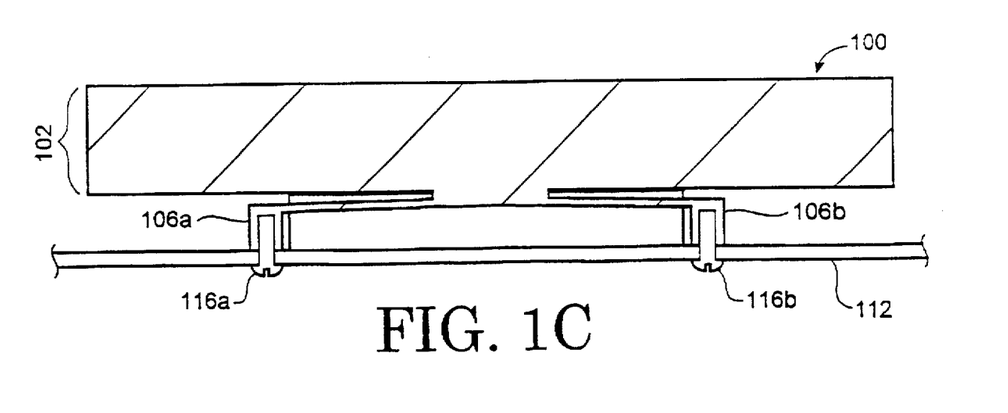
FIG. 1C is a side cut-away view of a heat sink unit coupled to a substrate such that the heat sink unit is disposed against a heat generating device mounted to the substrate in accordance with the present claimed invention.

Referring now to FIG. 1C, a side cut-away view is shown in which a heat sink unit 100 is coupled to a substrate 112 such that thermally conductive unit 102 is disposed against a heat generating device 110 mounted to substrate 112. As shown in FIG. 1C, in the present embodiment, the length of posts 106a and 106b is slightly shorter than the height/thickness of heat generating device 110. Thus, when heat sink unit 100 is placed on top of heat generating device 110, the bottom surface of posts 106a and 106b reside slightly above substrate 112. In the present invention, attachment units extend through holes 114a–114d in substrate 112. In the present embodiment, the attachment units are screws. Thus, screw 116a extends through substrate 112 and is inserted into threaded hole 108a of post 106a. Screw 116b extends through hole 114b in substrate 112 and is inserted into hole 108b of post 106b. Likewise, hidden screws 116c and 116d extend through substrate 112 and are inserted into hidden threaded holes 108c and 108d, respectively. Although screws are used as attachment units in the present embodiment, the present invention is also well suited to the use of other types of attachment units such as, for example, rivets, rigid columns, and the like, which extend into the openings formed into the bottom of posts 106a and 106b. Additionally, in an embodiment in which the posts do not have an opening formed into the bottom surface thereof, the present invention is also well suited to the use of attachment units such as, clamps, adhesives, and the like for coupling the posts to substrate 112.

As yet another advantage, as stated above, the present invention is formed of a single piece of material. As such, the present invention is well suited to being formed using low cost die-cast or extrusion manufacturing processes. For example, in an extrusion process the general shape of the present invention is formed during the extrusion step, while threaded openings and the like are refined during subsequent machining operations. Such low cost manufacturing processes significantly reduce the cost of the present invention with respect to prior art combinational heat sink devices. Specifically, the present invention can be made for a few dollars, whereas many prior art combinational heat sink devices cost as much as ten to fifteen dollars to make. Additionally, the present invention can be made quickly using die-cast or extrusion manufacturing processes. As a result, the present invention can be made much more quickly than many prior art combinational heat sink devices. Also, by reducing the number of components in the heat sink unit, the present invention is also lighter than many prior art combinational heat sink units.

With reference still to FIG. 1C, as stated above, the length of posts 106a and 106b is slightly shorter than the height/thickness of heat generating device 110 in the present embodiment. As a result, horizontal portion 105 and attached posts 106a and 106b are bent or pulled away from thermally conductive unit 102 towards substrate 112 when posts 106a and 106b are screwed to substrate 112. In so doing, the present invention pulls thermally conductive unit 102 firmly against heat generating device 110. Thus, flexible connector 104 of the present invention insures that thermally conductive unit 102 of heat sink unit 100 is in good thermal contact with heat generating device 110 when the posts of flexible connector 104 are attached to substrate 112.

In the present embodiment, the top surface of heat generating device 110 resides within recessed area 109 of FIG. 2. The surface of recessed area 109 is designed to accommodate the shape of the top surface of heat generating device 110. Thus, when the top surface of heat generating device 110 contacts the bottom surface of thermally conductive unit 102 uniform pressure is maintained between thermally conductive unit 102 and heat generating device 110. Therefore, the present invention provides efficiently and reliably couples heat sink unit 100 to heat generating device 110 and underlying substrate 112. Furthermore, the present invention efficiently and reliably couples heat sink 100 to heat generating device 110 and underlying substrate 112 without requiring complicated and difficult to manufacture connecting components. That is, the present invention eliminates the need for multiple complex connecting components found in the prior art. The present invention is also well suited to having a thermal transfer mechanism such as a thermal pad, thermal grease, and the like disposed between the bottom surface of thermally conductive unit 102 and the top surface of heat generating device 110.

With reference still to FIG. 1C, in the present embodiment each post of flexible connector 104 pulls thermally conductive unit 102 towards heat generating device 110 with approximately 15–20 pounds of pressure. Thus, in the present embodiment, the four posts, posts 106a–106d, uniformly press thermally conductive unit 102 against heat generating device 110 with approximately 60–80 total pounds of pressure. The present invention is also able to vary the amount of pressure applied by each of the posts of flexible connector 104. Specifically, by increasing the thickness of horizontal portion 105, the amount of force needed to pull or bend the posts away from thermally conductive unit 102 also increases. Thus, instead of having each post of flexible connector 104 pull thermally conductive unit 102 towards heat generating device 110 with approximately 15–20 pounds of pressure, the present invention is well suited to increasing the amount of pressure applied by each of the posts. Thus, the four posts, posts 106a–106d, can uniformly press thermally conductive unit 102 against heat generating device 110 with more than approximately 60–80 total pounds of pressure. Likewise, the present invention can decrease the amount of pressure applied by each of the posts by decreasing the thickness of each of the posts. Hence, a user of the present invention can manipulate the thickness of the horizontal portion 105 and 107 to achieve a precise desired pressure between thermally conductive unit 102 and heat generating device 110. Additionally, it will be understood that the present invention is also well suited to varying the amount of pressure applied between thermally conductive unit 102 and heat generating device 110 by increasing or decreasing the amount of posts in flexible connector 104.

Figure 4:
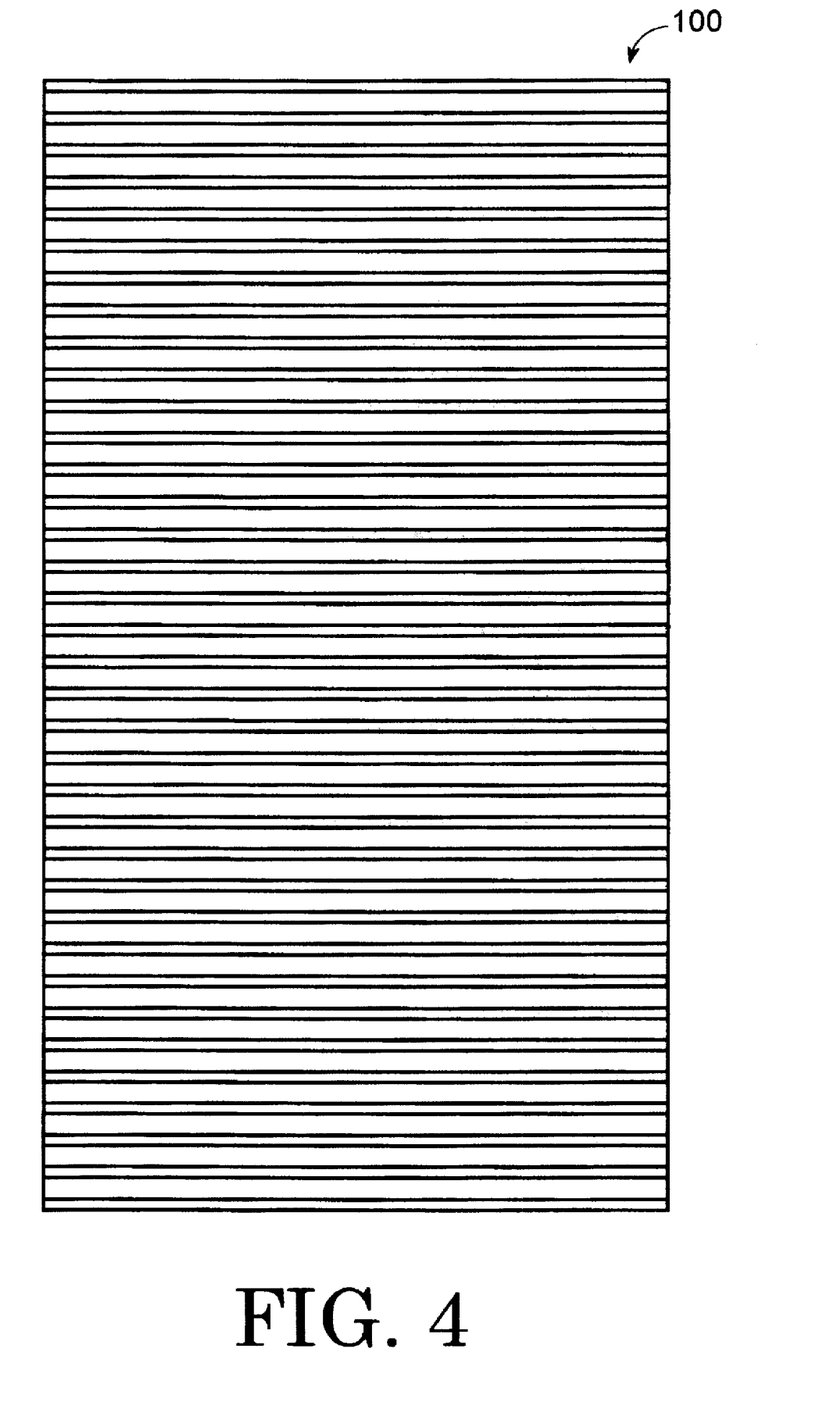
FIG. 4 is a top plan view of a heat sink unit in accordance with the present claimed invention.

With reference next to FIG. 4, a top plan view of heat sink unit 100 is shown. Unlike many prior art combinational heat sink devices, the present invention does not require removing any part of the heat radiating portion to accommodate attaching the connector portion thereto. That is, because flexible connector 104 is integral with thermally conductive unit 102, both of FIGS. 1A–1C, no special connecting devices are necessary, and hence no portion of the cooling fins need be removed. As shown in FIG. 4, all of the cooling fins present on the top surface of thermally conductive unit 102 remain intact. Therefore, the effectiveness of the cooling fins is not compromised in the invention. Similarly, the present invention does not require removing any other type of heat radiating structure which may be present on the top surface of thermally conductive unit 102.

Figure 5A:
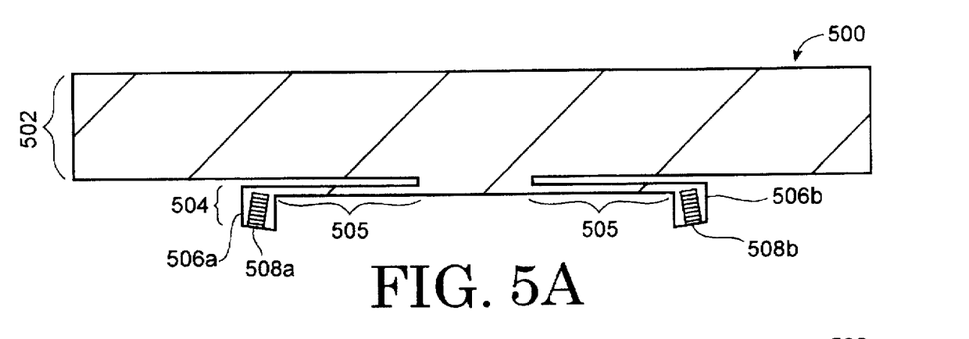
FIG. 5A is a side cut-away view of a heat sink unit having beveled posts in accordance with the present claimed invention.

With reference next to FIG. 5A a side cut-away view of a heat sink unit 500 in accordance with the present invention is shown. In the present embodiment, heat sink unit 500 is comprised of a thermally conductive unit 502 and a flexible connector portion 504. Flexible connector 504 is integral with thermally conductive unit 502. That is, flexible connector 504 and thermally conductive unit 502 are formed of the same piece of material. The embodiment of FIG. 5A includes features described above in detail in conjunction with the embodiment of FIG. 1A. That is, the present embodiment includes a flexible connector 504 having a horizontal portion 505 and a plurality of vertically oriented posts 506a and 506b which extend from horizontal portion 505. The present embodiment further includes posts 506c and 506d which are hidden behind posts 506a and 506b, respectively. The present embodiment also includes a hidden horizontal portion 507 to which hidden posts 506c and 506d are attached. In the present embodiment, flexible connector 504 can be bent or moved with respect to thermally conductive unit 502. Additionally, in the present embodiment, posts 506a and 506b have threaded openings 508a and 508b, respectively, formed into the bottom surface thereof. Likewise, in the present embodiment, hidden posts 506c and 506d have threaded openings 508c and 508d, respectively, formed into the bottom surface thereof. Although four posts are recited in the present embodiment, the present invention is also well suited to having a fewer or greater number of posts.

With reference still to FIG. 5A, in the present embodiment the bottom surface of posts 506a and 506b is beveled. That is, the bottom surface of posts 506a and 506b is not perpendicular to the side of posts 506a and 506b. In the present embodiment each of posts 506a–506d have a threaded opening 508a–508d, respectively, formed into the bottom surface thereof. As shown in FIG. 5A, threaded openings 508a–508d extend into posts 506a–506d and are not parallel to the sides of posts 506a–506d. Although threaded openings are recited in the present embodiment, the present invention is also well suited to having non-threaded openings formed into the bottom of the posts, or to not having any openings formed into the bottom of the posts.

Figure 5B:
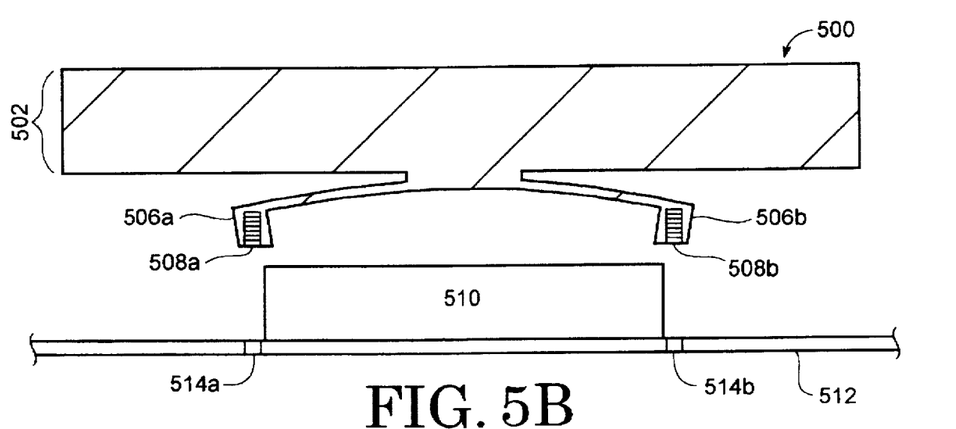
FIG. 5B is a side cut-away view of a heat sink unit having beveled posts, wherein the heat sink unit is disposed above a heat generating device mounted to a substrate in accordance with the present claimed invention.

Referring now to FIG. 5B, a side cut-away view of heat sink unit 500 disposed above a thick heat generating device 510 mounted on a substrate 512 is shown. In the present embodiment, the length of posts 506a–506d is much shorter than the height/thickness of heat generating device 510. Thus, if heat sink unit 500 is placed on top of heat generating device 510, the bottom surface of posts 506a and 506b would reside a substantial distance above substrate 512. Thus, in order for the bottom surface of posts 506a and 506b to be placed in contact with substrate 512, posts 506a and 506b must be substantially bent or pulled away thermally conductive unit 502 as shown.

Referring still to FIG. 5B, in the present embodiment, the bottom surface of each of posts 506a–506d is beveled such that the bottom surface of each of posts 506a–506d is parallel to substrate 512 only when posts 506a–506d are substantially bent or pulled away from thermally conductive unit 502. Likewise, in the present embodiment, openings 508a–508d are perpendicular to substrate 512 only when posts 506a–506d are substantially bent or pulled away from thermally conductive unit 502. In the present embodiment, holes 514a–514d are formed into substrate 512. Holes 514c and 514d are hidden from view in FIG. 5B. Holes 514a–514d are located such that the bottom surface of each of posts 506a–506d will reside directly above holes 514a–514d, respectively, once posts 506a–506d are bent as indicated in FIG. 5B.

Figure 5C:
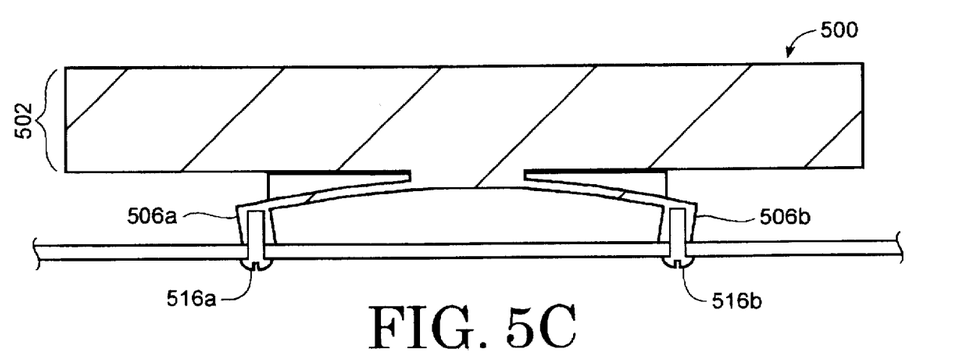
FIG. 5C is a side cut-away view of a heat sink unit having beveled posts coupled to a substrate such that the heat sink unit is disposed against a heat generating device mounted to the substrate in accordance with the present claimed invention.

With reference next to FIG. 5C, a side cut-away view is shown in which a heat sink unit 500 is coupled to a substrate 512 such that thermally conductive unit 502 is disposed against heat generating device 510 mounted to substrate 512. As shown in FIG. 5C, beveled posts 506a and 506b are bent such that the bottom surface of each of posts 506a and 506b is parallel to substrate 512. Likewise, threaded openings 508a and 508b are perpendicular to substrate 512 when posts 506a and 506b are bent as shown in FIG. 5C. Thus, threaded openings 508a and 508b are positioned to receive attachment means extending from substrate 512 once posts 506a and 506b are bent as shown in FIG. 5C. In the present embodiment, screws are used to attach posts 506a–506d of flexible connector 504 to substrate 512. Thus, screw 516a extends through substrate 512 and is inserted into threaded hole 508a of post 506a. Screw 516b extends through hole 514b in substrate 512 and is inserted into hole 508b of post 506b. Likewise, hidden screws 516c and 516d extend through substrate 512 and are inserted into hidden threaded holes 508c and 508d, respectively. Although screws are used as attachment units in the present embodiment, the present invention is also well suited to the use of other types of attachment units such as, for example, rivets, rigid columns, and the like, which extend into the openings formed into the bottom of posts 506a and 506b.

Hence, the present invention can accommodate virtually any thickness of different heat generating devices. In fact, the length of posts 506a–506d can be specifically tailored to accommodate a specific thickness of a specific heat generating device. Furthermore, as mentioned above, the present invention is also well suited to varying the amount of pressure applied by each of the posts of flexible connector 504. Additionally, the present invention is also well suited to varying the amount of pressure applied between thermally conductive unit 502 and heat generating device 510 by increasing or decreasing the amount of posts in flexible connector 504.

Figure 6A:
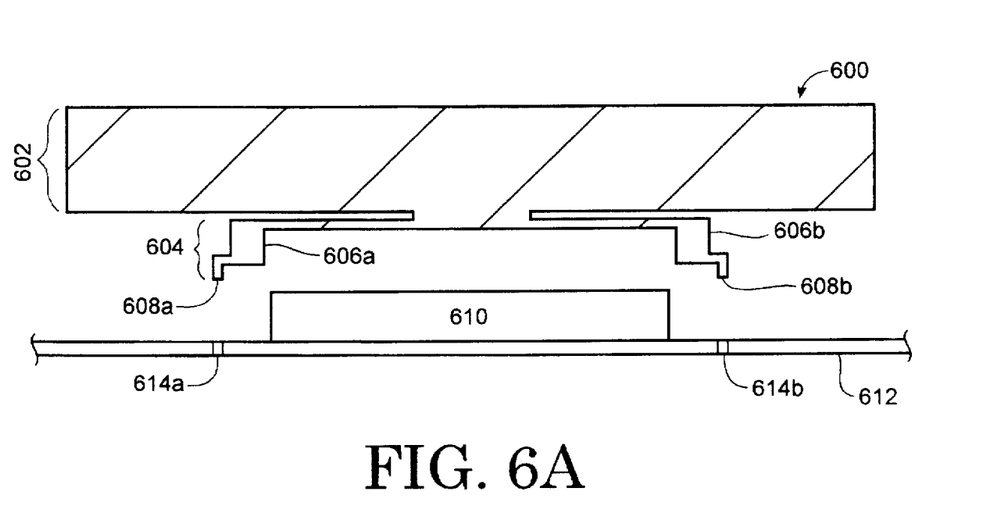
FIG. 6 is a side cut-away view of another embodiment of a heat sink unit in accordance with the present claimed invention.
Figure 6B:
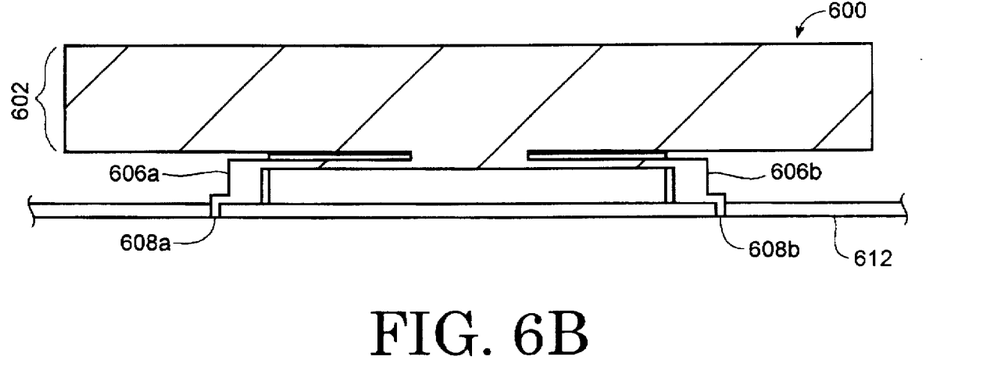

With reference next to FIG. 6, a side cut-away view of another heat sink unit 600 in accordance with the present invention is shown. As described above in conjunction with the embodiments of FIGS. 1A–1C and FIGS. 5A–5C, heat sink unit 600 is comprised of a thermally conductive unit 602 and a flexible connector portion 604. In the present invention, flexible connector 604 is integral with thermally conductive unit 602. That is, flexible connector 604 and thermally conductive unit 602 are formed of the same piece of material. Thus, the present invention is a single heat sink unit in which flexible connector 604 is an extension of thermally conductive unit 602 or vice versa. In the present embodiment, flexible connector 604 includes a horizontal portion 605 and a plurality of vertically oriented posts 606a and 606b which extend from horizontal portion 605. The present embodiment further includes posts 606c and 606d which are hidden behind posts 606a and 606b, respectively. The present embodiment also includes a hidden horizontal portion 607 to which hidden posts 606c and 606d are attached. As shown in FIG. 6, posts 606a and 606b extend outwardly from thermally conductive unit 602. In the present invention, flexible connector 604 is pliable. That is, flexible connector 604 can be bent or moved with respect to thermally conductive unit 602. Thus, in the present invention, horizontal portion 605 and attached posts 606a and 606b can be bent, for example, away from thermally conductive unit 602.

With reference still to FIG. 6, the present embodiment includes the features and advantages of the embodiments of FIGS. 1A–1C and FIGS. 5A–5C. However, the present embodiment has extruders 608a–608d which extend from posts 606a–606d. In FIG. 6, posts 606c and 606d and attached extruders 608c and 608d are hidden from view. Holes 614a and 614b are formed into substrate 612 in the present embodiment. Holes 614a and 614b are disposed such that they reside beneath extruders 608a and 608b of posts 606a and 606b. Likewise, in the present embodiment, hidden holes 614c and 614d are formed into substrate 612 such that they are disposed beneath extruders 608c and 608d, respectively. In the present embodiment, extruder 608a extends into hole 614a of substrate 612. Extruder 608b extends into hole 614b in substrate 612 and is inserted into hole 108b of post 106b. Likewise, hidden extruders 608c and 608d are inserted into hidden holes 614c and 614d, respectively. Hence, the present embodiment allows heat sink unit 600 to be attached to substrate 612 without the use of screws or other separate coupling devices.

Thus, the present invention provides a heat sink unit which can be efficiently and reliably coupled to a heat generating device and an underlying substrate, a heat sink unit which can be efficiently and reliably coupled to a heat generating device and an underlying substrate without requiring complicated and difficult to manufacture connecting components, and the present invention provides such advantages in a heat sink unit which does not have the substantial manufacturing costs associated with conventional heat sinks.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A heat sink having an integral attachment mechanism, said heat sink comprising:
   a thermally conductive unit adapted to thermally contact a heat generating device mounted on a substrate; and
   a flexible connector integral with said thermally conductive unit, said flexible connector adapted to couple said thermally conductive unit to said substrate such that said thermally conductive unit thermally contacts said heat generating device, said flexible connector further comprising:
      a plurality of posts extending outwardly from said thermally conductive unit, each of said plurality of posts having a side surface and a bottom surface, said bottom surface adapted to be disposed adjacent to the surface of said substrate on which said heat generating device is mounted, said bottom surface of each of said plurality of posts beveled such that said bottom surface of each of said plurality of posts is disposed substantially parallel to said substrate when said plurality of posts are bent.

2. A heat sink having an integral attachment mechanism, said heat sink comprising:
   a thermally conductive unit adapted to thermally contact a heat generating device mounted on a substrate; and
   a flexible connector integral with said thermally conductive unit, said flexible connector adapted to couple said thermally conductive unit to said substrate such that said thermally conductive unit thermally contacts said heat generating device, said flexible connector further comprising:
      a plurality of posts extending outwardly from said thermally conductive unit, each of said plurality of posts having a side surface and a bottom surface, said bottom surface adapted to be disposed adjacent to the surface of said substrate on which said heat generating device is mounted, said bottom surface of each of said plurality of posts beveled such that said bottom surface of each of said plurality of posts is disposed substantially parallel to said substrate when said plurality of posts are bent, said bottom surface of each of said plurality of posts having an opening formed therein for receiving a respective attachment unit extending from said substrate.

3. A heat sink having an integral attachment mechanism, said heat sink comprising:
   a thermally conductive unit adapted to thermally contact a heat generating device mounted on a substrate; and
   a flexible connector integral with said thermally conductive unit, said flexible connector adapted to couple said thermally conductive unit to said substrate such that said thermally conductive unit thermally contacts said heat generating device, said flexible connector further comprising:
      a plurality of posts extending outwardly from said thermally conductive unit, each of said plurality of posts having a side surface and a bottom surface, said bottom surface adapted to be disposed adjacent to the surface of said substrate on which said heat generating device is mounted, said bottom surface of each of said plurality of posts beveled such that said bottom surface of each of said plurality of posts is disposed substantially parallel to said substrate when said plurality of posts are bent, said bottom surface of each of said plurality of posts having an opening formed therein for receiving a screw extending from said substrate.

4. A heat sink having an integral attachment mechanism, said heat sink comprising:
   a thermally conductive unit adapted to thermally contact a heat generating device mounted on a substrate; and
   a flexible connector integral with said thermally conductive unit, said flexible connector adapted to couple said thermally conductive unit to said substrate such that said thermally conductive unit thermally contacts said heat generating device, said flexible connector further comprising:
      a plurality of posts extending outwardly from said thermally conductive unit, each of said plurality of posts having a side surface and a bottom surface, said bottom surface adapted to be disposed adjacent to the surface of said substrate on which said heat generating device is mounted, said bottom surface of each of said plurality of posts having a threaded opening formed therein for receiving a respective screw extending from said substrate such that said thermally conductive unit can be screwed to said substrate, said bottom surface of each of said plurality of posts beveled such that said bottom surface of each of said plurality of posts is disposed substantially parallel to said substrate when said plurality of posts are bent.

* * * * *